United States Patent [19]
Darekar et al.

[11] Patent Number: 5,679,266
[45] Date of Patent: Oct. 21, 1997

[54] METHOD FOR ASSEMBLY OF PRINTED CIRCUIT BOARDS WITH ULTRAFINE PITCH COMPONENTS USING ORGANIC SOLDERABILITY PRESERVATIVES

[75] Inventors: Vijay S. Darekar; Chris N. Thornton; John W. Krueger, all of Temple, Tex.

[73] Assignee: Texas Instruments Incorporated, Dallas, Tex.

[21] Appl. No.: 587,349

[22] Filed: Jan. 16, 1996

[51] Int. Cl.⁶ .................................................... B44C 1/22
[52] U.S. Cl. ........................... 216/13; 216/20; 216/41
[58] Field of Search ............................... 216/13, 33, 20, 216/41, 84; 29/846

[56] References Cited

U.S. PATENT DOCUMENTS 5,480,048   1/1996   Kitamura et al. .................... 216/13

Primary Examiner—William Powell
Attorney, Agent, or Firm—Ronald O. Neerings; James C. Kesterson; Richard L. Donaldson

[57] ABSTRACT

A method of assembling a printed circuit (PC) boards with ultrafine pitch components. The method comprises: attaching a coarse pitch components on the PC board; applying solvent to the thermal pads of the ultrafine pitch components; mounting a die-attach film on the thermal pads; curing the die-attach film; applying solvent to the die-attach film; forming component leads for the ultrafine pitch components; aligning the ultrafine pitch components to the solder pads; attaching the component leads to the solder pads and the ultrafine pitch components to the thermal pads. Other devices, systems and methods are also disclosed.

10 Claims, 2 Drawing Sheets

METHOD FOR ASSEMBLY OF PRINTED CIRCUIT BOARDS WITH ULTRAFINE PITCH COMPONENTS USING ORGANIC SOLDERABILITY PRESERVATIVES

FIELD OF THE INVENTION

This invention generally relates to assembly of printed circuit boards with ultrafine pitch components.

BACKGROUND OF THE INVENTION

Without limiting the scope of the invention, its background is described in connection with printed circuit boards (PC boards) with ultrafine pitch components, specifically PC boards for personal computers.

With the evolution of modern electronics, virtually every component of the electronics becomes more complex. One of these items consists of a printed circuit board. This board houses all the semiconductor chips and circuits that allows that printed circuit board to execute its function and communicate to devices outside that board. Currently, these printed circuit boards are increasing in complexity and decreasing in size. Moreover, most of today's printed circuit boards consist of many types of semiconductor components. Some of the components have different size leads, while some of the components have different types of mounts. Accordingly, some of these components have different mounting techniques that work better than others, and may not be compatible with the mounting techniques of all components. Therefore, either a single board has to go through several mounting techniques, or a mounting technique has to be used that is compatible with all of the components. There are several techniques which may be used to mount different semiconductor devices. In addition, increased miniaturization in the electronics industry is causing more and more components to be placed onto circuit boards by the Tape Automated Bonding (TAB) method. Securing the leads on the device to the board can be achieved by two processes—"Formed Lead" and "No Form" process. Each has its advantages and disadvantages.

Another method used to attach devices to the printed circuit board is conventional Surface Mount Technology (SMT) primarily used for mounting components with leads to PC boards. SMT techniques use solder paste screening and an oven reflow process.

Ultrafine pitch (lead pitch of 12 mils or lower) semiconductor devices (e.g. Intel's microprocessors) which are mounted on flexible carriers cannot be assembled to the PC printed circuit board by conventional SMT. On the contrary, for the assembly of such ultrafine pitch devices, the solder on the copper pads of the PC board needs to be deposited by electrodeposition and a subsequent selective etching process. This is time consuming and expensive. Secondly, although much less expensive copper protective coatings (e.g. Organic Solderability Preservative) work well for conventional assembly of fine and coarse pitch active components, these coatings cannot be used for ultrafine pitch components. The organic solderability preservative (OSP) chemicals are incompatible with predeposited solder on pads of the ultrafine pitch components. Because of these two problems the cost of the PC board is very high, even before the component assembly.

Conventional methods to attach ultrafine components vary in complexity, but all are costly. In one solution, the solder is deposited on the ultrafine pitch pads by electrodeposition process. The pads are then masked by a temporary solder mask during an OSP coating process. The board is then assembled by conventional assembly operations after removing the temporary mask. This adds a masking operation without eliminating electrodeposition. Therefore, this solution does not result in any cost savings. In addition, there is no flexibility of rework operation if needed.

In another solution, ultrafine pitch pads are screen printed in a group (bar printing) with the solder paste and then mass reflowed. This method requires a special solder mask and an unconventional solder alloy paste. This paste is expensive and there is a wide variation in the solder deposited on the pads with poor SMT yields. This solution also does not result in any cost savings.

SUMMARY OF THE INVENTION

The elimination of the electrodeposition process could produce a tremendous cost savings to each PC board. However, the process can only be eliminated if a suitable alternative can be developed to deposit solder on the ultrafine pitch pads followed by component joining after the OSP coating is applied to the board. The present invention is an alternative which eliminates the expensive pre-assembly process of electrodeposition of solder.

In the process of the present invention, the PC boards are coated with solder mask and organic solderability preservative after circuitization. However, no solder is applied to the board at this point. The pads of ultrafine pitch components are then coated with solder by a solder dispensing tool in a controlled manner either before or after the assembly of the coarse pitch components. The ultrafine pitch components are then joined to the pads either by mass reflow or by thermode.

In sum, this process results in reduced cycle time and tremendous cost savings of 10% to 15% of the board cost. The process also eliminates expensive solder electrodeposition process reducing cycle time. The process also makes the use of more economical OSP coatings possible, which also improves the yield. In addition, the process facilitates heat flow and makes the heat-sink and die attach process easier. Moreover, it enhances the printability of SMT pads which reduces defects and improves the SMT yield. Further, the process improves the coplanarity of ultrafine pitch pads resulting in better SMT yield.

The process of the present invention would be cost effective in current portable computer main PC boards as well as future boards where TAB/TCP microprocessor assembly is needed. The process can also be used for rework operations at any stage. In addition, the process could be used in applications like BGA and Flip-Chip assemblies.

The present invention relates to a method of assembling a printed circuit (PC) boards with ultrafine pitch components. The method may comprise: attaching coarse pitch components on the PC board; applying solvent to the thermal pads of the ultrafine pitch components; mounting a die-attach film on the thermal pads; curing the die-attach film; applying solvent to the die-attach film; forming component leads for the ultrafine pitch components; aligning the ultrafine pitch components to the solder pads; attaching the component leads to the solder pads and the ultrafine pitch components to the thermal pads. Other devices, systems and methods are also disclosed.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Utrafine pitch components cannot be soldered flawlessly to a PC board by conventional surface mount techniques (SMT). More restrictions apply when an economical compound like an organic solderability preservative (OSP) is used on the board instead of an expensive solder coating. To eliminate these problems, a new process has been developed by modifying and combining various techniques to make the assembly robust.

Figure 1:
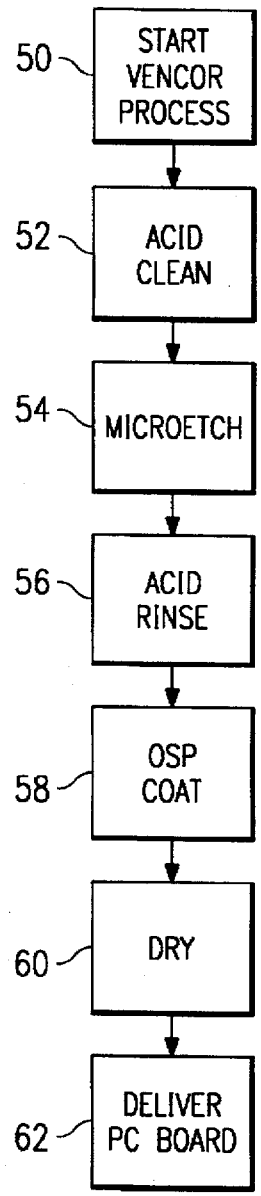
FIG. 1 is a flow chart of OSP application to the PC board at the vendor.

The first stage in this assembly process is to apply a solder mask to the printed circuit board. The PC board is then processed to form an organo-metallic coating to protect exposed copper pads from oxidation and corrosion during storage and further processing. No solder is present anywhere on the board at this stage. This first stage is typically done at the site of the PC board vendor, and is depicted by the flow chart of FIG. 1. The steps at this stage are: acid clean the PC board 52, then microetch the PC board 54, followed by an acid rinse of the board 56, then an OSP coating 58 by dipping the PC board in an organic solution, followed by a drying process 60. The organic solution used is an organic-nitrogen compound like Benzimidazole (e.g. a commercial solution like ENTEK-PLUS Cu-106 manufactured by Enthone-OMI, Inc.). The printed circuit board is then typically delivered to the computer manufacturer. However, the PC board can be processed from beginning to end at one location.

Figure 2:
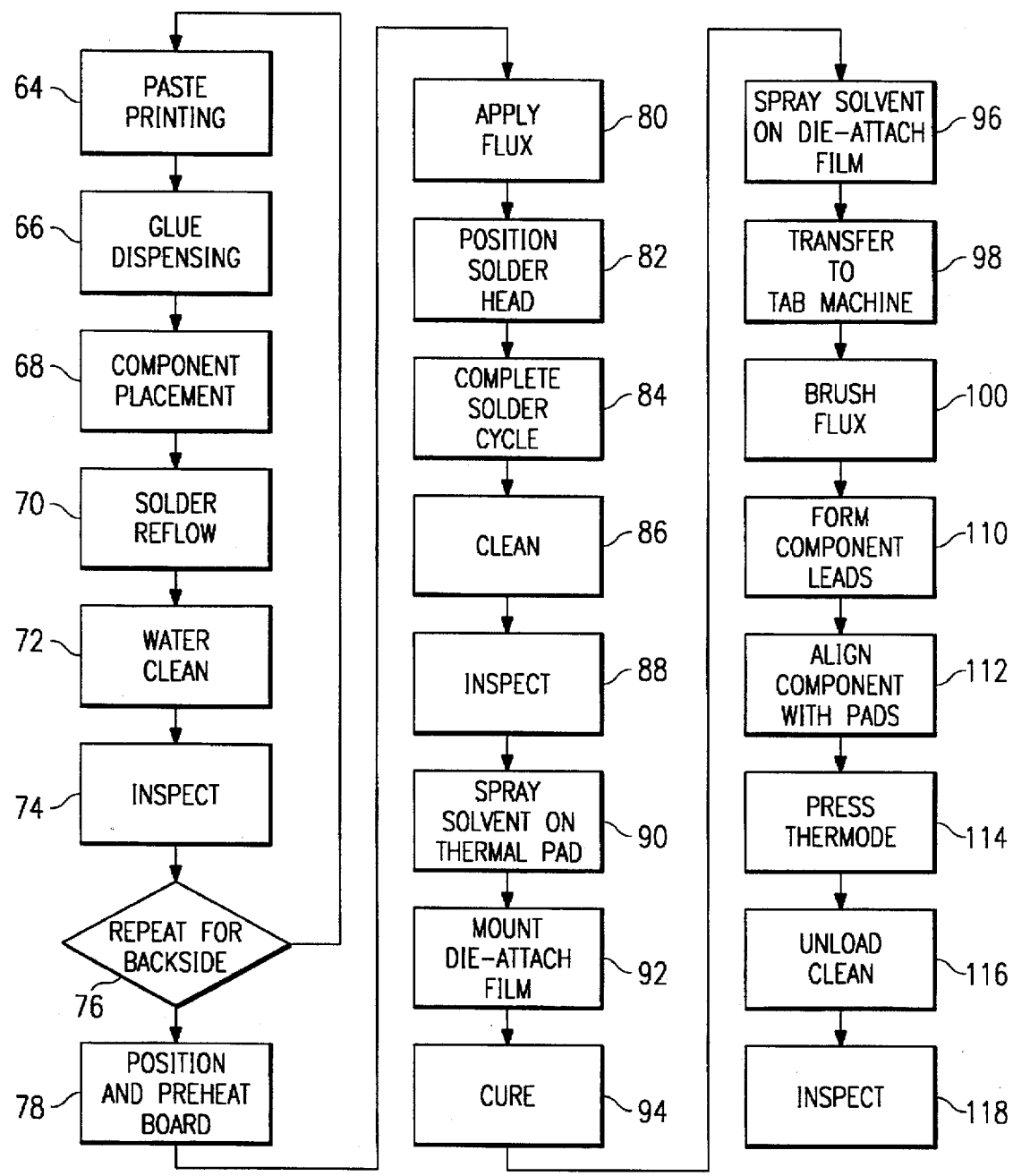
FIG. 2 is a flow chart of the method for assembling components onto the PC board.

FIG. 2 is a flow chart of the method for assembling components onto the PC board, in accordance with the teachings of the present invention. Coarse pitch components (16 mils pitch and above) are first solder joined to the coated circuit board received from the vendor by the following steps: first paste is printed 64 on the PC board, then glue is dispensed 66, then the components are placed 68, then the board goes through solder reflow 70, then water rinse 72 (deleted in case of no-clean paste), and then inspection 74. These steps are then repeated for the other side of the board 76.

The ultrafine pitch components are usually processed next. The board is first positioned 78 on the solder depositing machine and then preheated. Then, the pads are coated with either water soluble flux or no-clean flux 80. The nozzle, which dispenses controlled volume, is then positioned on the starting point of the footprint 82. The programmed movement of the nozzle deposits molten solder of an eutectic composition on each solder pad on the printed circuit board in sequence and then completes the round 84. The board is then cleaned with de-ionized water (this step is deleted in case of no-clean flux) 86. The board is then inspected for proper solder deposition 88.

The TAB/TCP assembly is completed in the following steps: the die-attach film (silver-filled thermoplastic) is attached 92 to the thermal pad by spraying the solvent 90 and subjecting the board to cure cycle (190 degrees F. for 5 min.) 94. The solvent is then sprayed on the top of the TAB attached film 96 and the board is inserted in the TAB bonding machine 98 where the flux is applied to the solder coated pads 100. After lead forming 110, the tape mounted component is aligned on the pads 112 and pressed with a heated thermode 114 (275 degrees C., with 3 lbs force and 5-10 sec. dwell time). The board is unloaded 116 and inspected 118. This completes the assembly process for the OSP treated boards with ultrafine pitch components. The PC board is now ready for integration.

Figure 3:
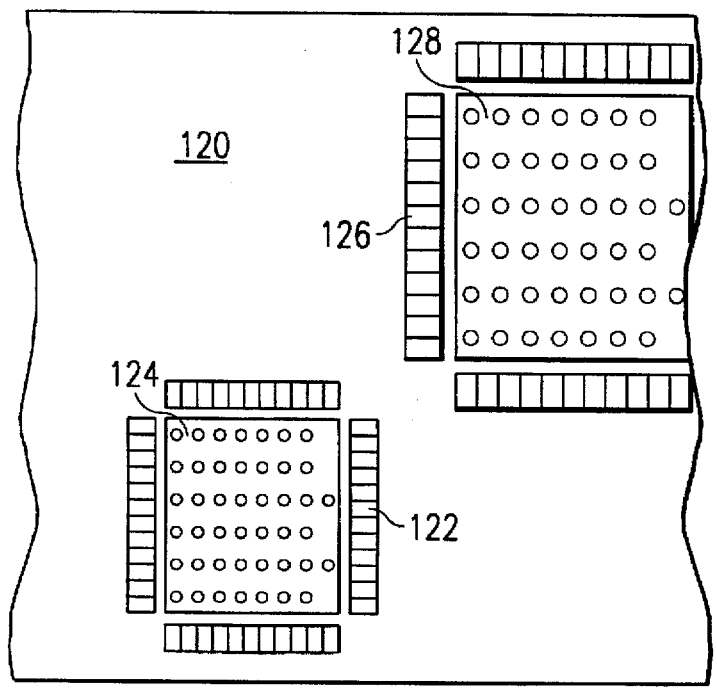
FIG. 3 is a diagram of a portion of a PC board.

FIG. 3 shows a diagram of a portion of a PC board 120. The figure depicts a thermal pad 124 for an ultrafine pitch component, along with solder pads 122. In addition, the solder pads 126 and thermal pad 128 are shown for a coarse pitch component. Conventional PC boards would probably have many more components and other circuitry. However, FIG. 3 omits other components for the sake of clarity.

Figure 4:
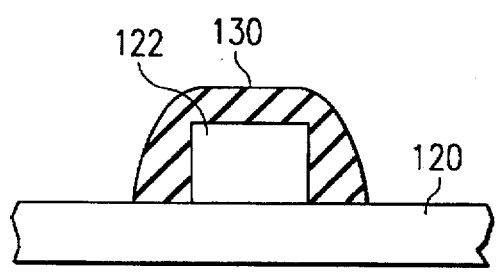
FIG. 4 is a portion of a cross-sectional view of an ultrafine pitch component solder pad of the PC board of FIG. 3.

FIG. 4 is a portion of a cross-sectional view of an ultrafine pitch component solder pad of the PC board of FIG. 3. The figure depicts the directly deposited solder 130 on a copper pad 122, on PC board 120.

In summary, the elimination of the electrodeposition process could produce a tremendous cost savings to each PC board. However, the process can only be eliminated if a suitable alternative can be developed to deposit solder on the ultrafine pitch pads followed by component joining after the OSP coating is applied to the board. The present invention is an alternative which eliminates the expensive pre-assembly process of electrodeposition of solder.

The present invention results in reduced cycle time and tremendous cost savings of 10% to 15% of the board cost. The process also eliminates expensive solder electrodeposition process reducing cycle time. The process also makes the use of more economical OSP coatings possible, which also improves the yield. Additionally, the process facilitates heat flow and makes the heatsink and die attach process easier. Moreover, it enhances the printability of SMT pads which reduces defects and improves the SMT yield. Moreover, the process improves the coplanarity of ultrafine pitch pads resulting in better SMT yield.

In addition, the present invention would be cost effective in current portable computer main PC boards as well as future boards where TAB/TCP microprocessor assembly is needed. The process can also be used for rework operations at any stage. Furthermore, the process could be used in applications like BGA and Flip-Chip assemblies.

While this invention has been described with reference to illustrative embodiments, this description is not intended to be construed in a limiting sense. For example, process diagrams are also representative of flow diagrams for micro-coded and software based embodiments. In addition, various modifications and combinations of the illustrative embodiments, as well as other embodiments of the invention, will be apparent to persons skilled in the art upon reference to the description. Words of inclusion are to be interpreted as nonexhaustive in considering the scope of the invention. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of assembling coarse pitch components and ultrafine pitch components on a printed circuit (PC) board, said method comprising:

providing a PC board having ultrafine pitch components with thermal pads and solder pads;

attaching coarse pitch components on said PC board;

mounting a die-attach film on said thermal pads;

curing said die-attach film;

applying solvent to said die-attach film;

forming component leads on said ultrafine pitch components;

aligning said component leads to said solder pads; and mounting said ultrafine pitch components to said thermal pads.

2. The method of claim 1, wherein said attaching coarse pitch components includes:

paste printing a frontside of said PC board;

dispensing glue on said frontside of said PC board;

placing coarse pitch components on said frontside of said PC board;

reflowing said frontside of said PC board; and repeating said paste printing, said dispensing said placing and said reflowing steps for a backside of said PC board.

3. The method of claim 1, further including:

positioning said PC board in a solder dispensing machine; and heating said PC board in said solder dispensing machine; and applying flux to said solder pads.

4. The method of claim 1, wherein said curing said die-attach film consists of curing at 190 degrees Fahrenheit (88 degrees Celsius) for 5 minutes.

5. The method of claim 1, wherein said method further includes pressing said ultrafine pitch components with a heated thermode.

6. A method of assembling coarse pitch components and ultrafine pitch components on a printed circuit (PC) board, said method comprising:

providing a PC board having ultrafine pitch components with thermal pads and solder pads;

paste printing a frontside of said PC board;

dispensing glue on said frontside of said PC board;

placing coarse pitch components on said frontside of said PC board;

reflowing said frontside of said PC board;

repeating said paste printing, said dispensing, said placing, and said reflowing for a backside of said PC board;

applying solvent to said thermal pads of said ultrafine pitch components;

mounting a die-attach film on said thermal pads;

curing said die-attach film;

applying solvent to said die-attach film;

forming component leads on said ultrafine pitch components;

aligning said component leads to said solder pads; and mounting said ultrafine pitch components to said thermal pads.

7. The method of claim 6, wherein said method further includes:

positioning said PC board in a solder dispensing machine; and heating said PC board in said solder dispensing machine; and applying flux to said solder pads.

8. The method of claim 6, wherein said curing said die-attach film consists of curing at 190 degrees Fahrenheit (88 degrees Celsius) for 5 minutes.

9. The method of claim 6, wherein said method further includes pressing said ultrafine pitch components with a heated thermode.

10. A method of assembling coarse pitch components and ultrafine pitch components on a printed circuit (PC) board, said method comprising:

providing a PC board having ultrafine pitch components with thermal pads and solder pads;

paste printing a frontside of said PC board;

dispensing glue on said frontside of said PC board;

placing coarse pitch components on said frontside of said PC board;

reflowing said frontside of said PC board;

rating said paste printing, said dispensing, said placing, and said reflowing for a backside of said PC board;

positioning said PC board in a solder dispensing machine; and heating said PC board in said solder dispensing machine; and applying flux to said solder pads;

applying solvent to said thermal pads of said ultrafine pitch components;

mounting a die-attach film on said thermal pads;

curing said die-attach film at 190 degrees Fahrenheit (88 degrees Celsius) for 5 minutes;

applying solvent to said die-attach film;

forming component leads on said ultrafine pitch components;

aligning said component leads to said solder pads;

mounting said ultrafine pitch components to said thermal pads; and pressing said ultrafine pitch components with a heated thermode.

* * * * *